(12) United States Patent
Reichenbach et al.

(10) Patent No.: US 11,304,330 B2
(45) Date of Patent: Apr. 12, 2022

(54) LOW-VOLTAGE SWITCHING DEVICE HAVING A DEFINED COOLING ARRANGEMENT

(71) Applicant: Siemens Aktiengesellschaft, Munich (DE)

(72) Inventors: Norbert Reichenbach, Amberg (DE); Peter Kaesbauer, Schwandorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 11 days.

(21) Appl. No.: 16/764,062

(22) PCT Filed: Nov. 14, 2018

(86) PCT No.: PCT/EP2018/081160
§ 371 (c)(1),
(2) Date: May 14, 2020

(87) PCT Pub. No.: WO2019/101589
PCT Pub. Date: May 31, 2019

(65) Prior Publication Data
US 2020/0375063 A1 Nov. 26, 2020

(30) Foreign Application Priority Data
Nov. 24, 2017 (EP) .................... 17203565

(51) Int. Cl.
*H05K 7/20* (2006.01)
(52) U.S. Cl.
CPC ....... *H05K 7/20145* (2013.01); *H05K 7/2019* (2013.01); *H05K 7/2039* (2013.01); *H05K 7/2089* (2013.01)

(58) Field of Classification Search
CPC .......... H05K 7/20145; H05K 7/20909; H05K 7/20736; H05K 7/2019; H05K 7/20172;
(Continued)

(56) References Cited

U.S. PATENT DOCUMENTS 5,091,823 A * 2/1992 Kanbara ............... H02M 7/003
361/697
5,831,847 A * 11/1998 Love .................. H05K 7/20945
363/141
(Continued)

FOREIGN PATENT DOCUMENTS

CN 101466250 A 6/2009
CN 204792426 U 11/2015
(Continued)

OTHER PUBLICATIONS

PCT International Search Report and Written Opinion of International Searching Authority dated Jan. 28, 2019 corresponding to PCT International Application No. PCT/EP2018/08116 filed Nov. 14, 2018.
Chinese Office Action dated Jul. 5, 2021.

*Primary Examiner* — Adam B Dravininkas
(74) *Attorney, Agent, or Firm* — Harness, Dickey & Pierce, P.L.C.

(57) ABSTRACT

A low-voltage switching device with a nominal device current range of up to 650 A, includes a defined cooling arrangement with a structure that has a lower and an upper device region. Power-electronic components are arranged in the lower device region. In at least one embodiment, only one coolant is provided in the low-voltage switching device. A second coolant is replaced with defined air flow channels.

20 Claims, 4 Drawing Sheets

(58) Field of Classification Search
CPC . H05K 7/20136; H05K 7/2039; H05K 7/2089
See application file for complete search history.

(56) References Cited

U.S. PATENT DOCUMENTS

| | | | | |
|---|---|---|---|---|
| 6,359,779 | B1* | 3/2002 | Frank, Jr. | G06F 1/18 |
| | | | | 361/679.33 |
| 8,363,408 | B2* | 1/2013 | Zheng | H01L 23/467 |
| | | | | 361/713 |
| 9,007,746 | B2* | 4/2015 | Rajvanshi | H05K 7/20581 |
| | | | | 361/678 |
| 2007/0159861 | A1* | 7/2007 | Meier | H05K 7/20918 |
| | | | | 363/63 |
| 2008/0180886 | A1* | 7/2008 | Dornauer | H05K 7/20172 |
| | | | | 361/676 |
| 2014/0160636 | A1* | 6/2014 | Rajvanshi | H05K 7/20581 |
| | | | | 361/608 |
| 2015/0342087 | A1 | 11/2015 | Donth | |
| 2017/0238445 | A1* | 8/2017 | Falk | H02M 7/44 |
| | | | | 361/694 |

FOREIGN PATENT DOCUMENTS

| | | |
|---|---|---|
| CN | 205142750 U | 4/2016 |
| CN | 105939095 A | 9/2016 |
| CN | 206533653 U | 9/2017 |
| EP | 0356991 A2 | 3/1990 |
| EP | 1733600 A1 | 12/2006 |
| EP | 1947920 A2 | 7/2008 |

* cited by examiner

LOW-VOLTAGE SWITCHING DEVICE HAVING A DEFINED COOLING ARRANGEMENT

PRIORITY STATEMENT

This application is the national phase under 35 U.S.C. § 371 of PCT International Application No. PCT/EP2018/081160 which has an International filing date of Nov. 18, 2018, which designated the United States of America, and which claims priority to European patent application no. EP17203565.1 filed Nov. 24, 2017, the entire contents of each of which are hereby incorporated herein by reference.

FIELD

Embodiments of the present application generally relate to a low-voltage switching device with a device rated current range of up to 650 A, having a defined cooling arrangement with a structure which has a lower and an upper device region, wherein power-electronics components are arranged in the lower device region.

BACKGROUND

In polyphase power supply systems, the majority of which are three-phase systems, power-electronics devices, such as soft starters for example, are used to control the power flow. To this end, each supply system phase contains power-electronics components, also called power sections, which influence the power flow in a suitable manner. In soft starters, a power section consists of two power-electronics components, these being thyristors which are connected back-to-back in parallel, which are provided with cooling devices such as heat sinks. The cooling device(s) are required in order to lead the thermal losses which are produced by the power controller in the power-electronics components away from the power-electronics components and therefore to prevent impermissible temperatures in the power-electronics components.

A further cooling device(s) is provided by fans for improving the dissipation of heat from the heat sinks. The fans permit a higher device rated current or else higher numbers of make/break operations. Mechanical bypass switching elements are often connected in parallel with the power sections, the mechanical bypass switching elements bridging the power sections in the operating phases in which no power control is required, so that electrical power loss no longer occurs in the power sections. The soft starter requires a control section for actuating the power sections and any bypass switching elements which may be present and also for supplying electrical power to a fan or else several fans. The control section also takes over the supply of power to the operator control unit of the device and also the supply of power to the communications assembly, such as a profibus interface for example.

The operator control unit and also the communications assembly can be a permanent part of the control section, but also can be integrated into the control section in the form of insertable units.

Furthermore, signaling relays which pass on certain operating states to external controllers have to be activated. In order to be able to fulfil these tasks, the control section has a powerful power supply unit for supplying power to these functional groups and also has one or more microprocessors which organize the interaction between the functional groups.

In comparison to previous soft starters, the range of functions of the control section has considerably increased, as has, consequently, the electrical power loss realized therein, this having increased by a factor of approximately 2-2.5. In addition to the resulting inherent heating, the control section and its integrated functional groups are subject to further heating by the power sections and also the power heat losses in the bypass switching elements and inner connecting lines. The object is therefore to cool the control section and its integrated functional groups such that impermissibly high temperatures are not produced at the structural elements of the control section and of the integrated functional groups during operation of the device.

The prior art discloses control sections with a considerably smaller integrated range of functions and a lower power loss. Therefore, the bypass switching elements and the fans were supplied with power directly from the voltage supply to which the control section was also connected. Similarly, the physical distance between the control section and the power sections was larger on account of the deeper housing, and therefore the ingress of heat therefrom into the control section was low. Measures for assisting natural convection, such as grid openings in the control section housing, were previously sufficient in order to keep the temperatures of structural parts in a permissible range.

The prior art also discloses using one or more separate fans for the control section or selecting a structurally larger control section with a relatively large housing surface, so that the power loss can be distributed more effectively and can be dissipated with natural convection. A further structural option is that of equipping the devices with a relatively large installation space in order to increase the distance between the control section and heat-generating power sections and to reduce the ingress of heat caused by them.

SUMMARY

The inventors have recognized that disadvantages of the solutions known from the prior art are that they are costly and structurally unfavorable.

Accordingly, at least one embodiment of the present invention provides a low-voltage switching device, in particular a soft starter, having a defined and space-optimized cooling arrangement.

At least one embodiment is directed to a low-voltage switching device. Advantageous embodiments and developments, which can be used on their own or in combination with one another, are the subject matter of the claims.

According to at least one embodiment of the invention, a low-voltage switching device with a device rated current range of up to 650 A, includes a defined cooling arrangement with a structure which has a lower and an upper device region, wherein power-electronics components are arranged in the lower device region. In at least one embodiment, only one cooling device is arranged in the low-voltage switching device and a second cooling device is replaced by defined air flow ducts.

BRIEF DESCRIPTION OF THE DRAWINGS

Further advantages and embodiments of the invention will be explained in more detail below with reference to an exemplary embodiment and also with reference to the drawing, in which.

DETAILED DESCRIPTION OF THE EXAMPLE EMBODIMENTS

Figure 1:
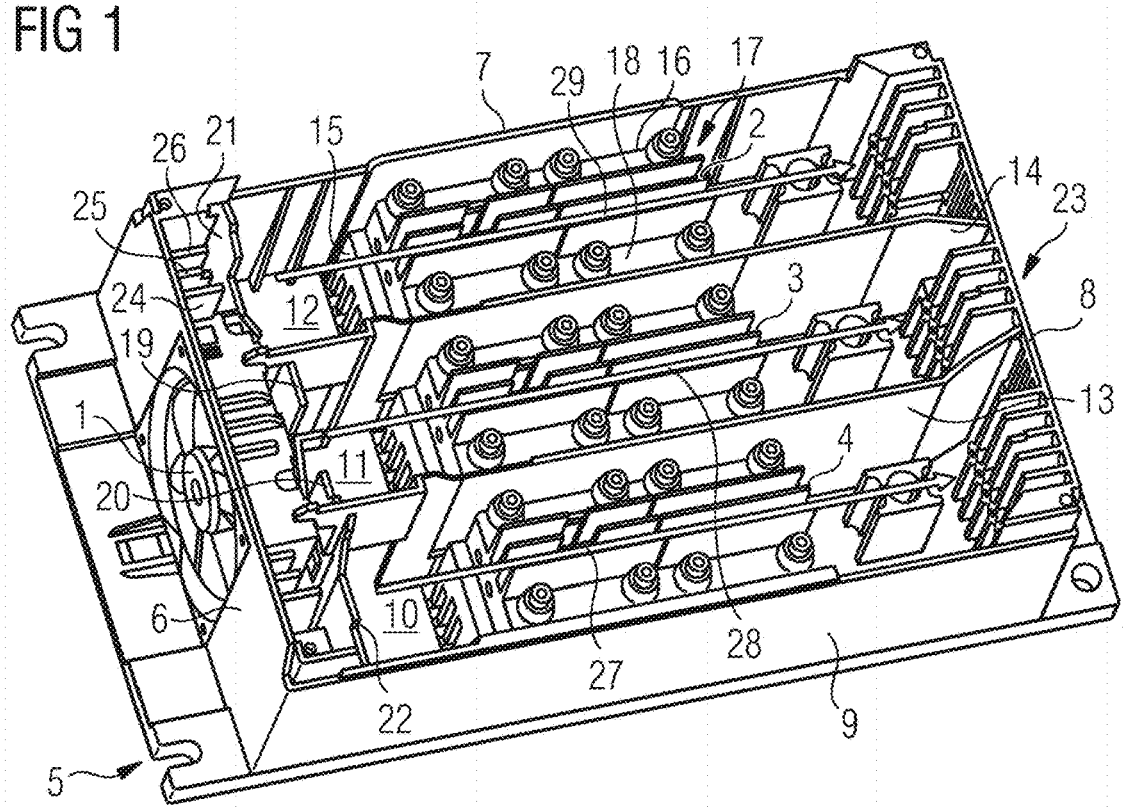
FIG. 1 shows a perspective illustration of a lower device region of a low-voltage switching device having a cooling device(s), which is designed as a fan by way of example here, and a defined design of the air throughflow ducts for downstream power-electronics components.

According to at least one embodiment of the invention, a low-voltage switching device with a device rated current range of up to 650 A, includes a defined cooling arrangement with a structure which has a lower and an upper device region, wherein power-electronics components are arranged in the lower device region. In at least one embodiment, only one cooling device is arranged in the low-voltage switching device and a second cooling device is replaced by defined air flow ducts.

The low-voltage switching device, in particular a soft starter, has a lower housing region comprising a cooling device(s) and preferably three power-electronics components. The cooling device(s) blows the cool air into the lower housing region. The main flow of the ingoing air passes through the power sections.

A further portion of the cool air entering the housing strikes air-guiding walls and is conducted into chambers, even before it can heat up to any appreciable extent. From there, the air is conducted upward and enters the upper housing region through openings in the top part.

A further additional portion of the air strikes a further set of air-guiding walls and is likewise conducted upward into a region above the fan and passes from there upward into the upper housing region, likewise through openings. Therefore, a secondary flow, which cools the control section, is produced in the upper housing region. In order that this secondary flow can mix with the hot air of the main flow as little as possible, the upper housing region has a largely closed floor which serves as a separating wall between the main and the secondary flow. The branching-off of a portion of the ingoing cool air immediately behind the cooling device(s), even before the air can heat up to any appreciable extent, and also the structural separation of the hot main flow (power section cooling) from the cold secondary flow (control section cooling) are the important points when solving the present problem.

In the solution illustrated here, the upper housing region consists of a central housing part and an upper housing part, wherein the upper housing part is preferably screwed onto the central housing part.

The upper house part contains a cutout for accommodating the control section and also a cutout for the communications module which is integrated into the control section or is separate. The air entering the central housing part now passes through at different points in the upper housing part and thereby cools the control circuit board, in particular an RC circuit flat assembly, the bottom side of the flat assembly contained in the control section, the communication module situated in the cutout and also the removable operator control unit situated in the control section in the cutout. The heated air then leaves the device via the grid openings which are made on the top side of the housing top part. In order that as much of the air entering the central housing part as possible flows through the control section and its functional groups so as to provide cooling and then exits at the top, the central housing part and the upper housing part have grid openings only on the top side. Openings on the other three sides (bottom, lateral) are limited to what is absolutely necessary.

The main advantage of the solution presented here is that additional cooling device(s), such as a fan for example, for cooling the control section is not required or is saved. An additional cooling device(s), such as a fan for example, would require additional space in the control section and would also have to be arranged such that its air flow reaches all the functional assemblies which are to be cooled. Given a complex structure like the control section shown here, this is not easy to implement and requires a certain degree of structural expenditure, and therefore the control section can then no longer be constructed as compactly. If the additional cooling device(s) is a fan, it would also have to be monitored and be replaceable. In contrast to this, in the case of the solution presented here, a distributed cooling air flow is generated, this flowing through all functional groups of the control section to a sufficient extent.

An inlet opening for the cool air would also have to be provided and would preferably have to be made on the top side of the control section since cool ambient air is only available there. However, the operator control unit or operator control elements or device-describing labels are fitted there. Therefore, this also requires structural expenditure in the control section, which expenditure makes the control section larger and more complex. The additional integration of an additional cooling device(s), such as a fan for example, into the control section can also lead to the device housing, which accommodates the control section, having to be adjusted and therefore the housing concept for the product series also having to be modified. The structural expenditure for the integration of a control section cooling device(s), such as a fan for example, can be considerable and even influence the housing concept of the product series overall. This expenditure is likewise dispensed with in the case of the described solution.

Furthermore, the control section has to provide the additional electrical power for the control section cooling device(s), such as a fan for example, and has to be dimensioned to be somewhat larger. This expenditure is also dispensed with in the case of the present solution.

In a particularly advantageous refinement of the invention, provision can be made for the cooling device(s), such as the fan for example, in the lower device region to guide a portion of the air flow in the form of partial air flows to the adjacent power-electronics components.

A progression according to at least one embodiment of the invention of this concept can involve a portion of the air flow being able to be guided on air-guiding walls which protrude from opposite side walls inward into the housing of the low-voltage switching device and form chambers in which air flow ducts which guide the air flow upward to the central device region are arranged.

In a further special continuation of the concept according to the invention, provision can be made for a portion of the air flow to be able to be guided on air-guiding walls which are positioned centrally in front of the fan in the low-voltage switching device and guide the air flow via air ducts upward into a region to the upper device region.

A progression according to at least one embodiment of the invention of this concept can make provision for the air flows which are guided upward into the upper device region to form a secondary flow which forms through a largely closed intermediate floor between the lower and the upper device region.

In a particularly advantageous refinement of at least one embodiment of the invention, provision can be made for air flows to be guided to the outside via grid openings in the housing of the low-voltage switching device.

A progression according to at least one embodiment of the invention of this concept can involve a communications module being arranged in a manner integrated in the control section or separately positioned in the low-voltage switching device.

In a further special continuation of the concept according to the invention, provision can be made for the low-voltage switching device to be a soft starter.

The low-voltage switching device according to at least one embodiment of the invention preferably has a cuboidal housing with a housing bottom side on which four side walls are arranged at an angle of approximately 90° in relation to one another and are closed off by a housing top side. The low-voltage switching device can be subdivided into two device regions, in particular a lower and an upper region, within the housing. The upper device region can be designed in one or several parts for structural and functional reasons, the upper device region being designed in two parts as a central and upper housing part in the solution presented here. Cooling device(s), such as one or more fans for example, which are positioned within a side wall can preferably be arranged in the lower housing region. On the inside, the region is divided into preferably three chambers downstream of the cooling device(s) in the housing. This division is preferably implemented by drawn-in partition walls in the housing interior. The chambers which are formed as a result are formed between two opposite side walls of the housing, specifically in such a way that power-electronics components positioned therein are oriented parallel in relation to one another and in the longitudinal direction in relation to the flow direction of the air ducts which are supplied with cooling air by the cooling device(s). The power-electronics components are preferably of cuboidal design and have four side walls, a top side and also a bottom side.

The central chamber is positioned directly downstream of the cooling device(s), that is to say centrally, in the direction of air flow. The other two chambers are respectively arranged on the opposite outer side walls of the housing of the low-voltage switching device. Partial walls in the form of air-guiding walls for the throughflow of air are respectively arranged following the cooling device(s) as a constituent part of the downstream chambers. In the case of the central chamber, two opposite air-guiding walls are preferably formed for the central chamber. Air-guiding walls which are formed in a manner drawn inward from the respective side walls of the housing were preferably respectively positioned for the outer chambers.

The parallel partition walls of the central chamber are preferably formed in a manner offset in the direction of air flow downstream of the air-guiding walls in such a way that they continue to run parallel to the side walls of the housing, but are oriented closer to one of the two side walls while maintaining the distance from one another. These partition walls of the central chamber are designed in a manner directed toward one another, preferably at an angle of approximately 10 to 20°, on the opposite side to the air-guiding walls.

The partial walls of the outer chambers define air shafts, in each case laterally next to the centrally positioned fan, which are further subdivided by inwardly directed partial walls, which are preferably oriented parallel in relation to one another, on the side wall in which the cooling device(s) is integrated and form defined air ducts.

Further obstructions to flow are fitted in the air inlet region of the central air duct on the floor, to the side of and above the power-electronics components. These flow duct modifications create the reduced flow through the central duct which is most favorable in terms of flow.

Openings of different sizes ensure an approximately identical throughflow or cooling effect for the two outer power sections. Therefore, the passage of air in the central region is smaller than the passage of air in the outer edge region.

FIG. 1 shows a lower device region according to an embodiment of the invention of a low-voltage switching device having a cooling device(s) 1, which is designed as a single fan by way of example here, and a defined design of the air throughflow ducts for downstream power-electronics components 2, 3, 4.

The low-voltage switching device according to an embodiment of the invention preferably has a cuboidal housing bottom part with a housing bottom side on which four side walls 6, 7, 8, 9 are arranged at an angle of approximately 90° in relation to one another and are closed off by a housing top side. The low-voltage switching device can be subdivided into two housing regions, into a lower and an upper region, within the housing 5. The upper housing region can be designed in one or several parts for structural and functional reasons, the upper housing region including a central and an upper housing part in the solution presented here.

A cooling device(s) 1, designed as a fan here, which is positioned within the side wall 6 can preferably be arranged in the lower housing region. On the inside, the region is divided into preferably three chambers 10, 11, 12 downstream of the fan in the housing bottom part. This division is implemented by drawn-in partition walls 13, 14 in the housing interior. The chambers 10, 11, 12 which are formed as a result are formed between two opposite side walls 7, 9 of the housing bottom part, specifically in such a way that power-electronics components 2, 3, 4 positioned therein are oriented parallel in relation to one another and in the longitudinal direction in relation to the flow direction of the air ducts which are supplied with cooling air by the fan. The power-electronics components 2, 3, 4 are preferably of cuboidal design and have four side walls 15, 16, 17, 18, a top side and also a bottom side.

The central chamber 11 is positioned directly downstream of the fan, that is to say centrally, in the direction of air flow. The other two chambers 10, 12 are respectively arranged on the opposite outer side walls 7, 9 of the housing bottom part of the low-voltage switching device. Air-guiding walls 19, 20, 21, 22 for the throughflow of air are respectively arranged following the fan as a constituent part of the downstream chambers 10, 11, 12. In the case of the central chamber 11, two opposite air-guiding walls 19, 20 are preferably formed for the central chamber. In each case one air-guiding wall 21, 22, which walls are drawn inward from the respective side walls 7, of the housing, was preferably positioned for the outer chambers 10, 12.

The parallel partition walls 13, 14 of the central chamber 11 are preferably formed in a manner offset in the direction of air flow downstream of the air-guiding walls in such a way that they continue to run parallel to the side walls 7, 9 of the housing bottom part, but are oriented closer to one of the two side walls 7, 9 while maintaining the distance from one another. These partition walls 13, 14 of the central chamber 11 are designed in a manner directed toward one another, preferably at an angle of approximately 10 to 20°, on the opposite side to the air-guiding walls, so that a constriction 23 is formed.

The air-guiding walls 21, 22 of the outer chambers 10, define chambers, in each case laterally next to the centrally positioned fan, which are further subdivided by inwardly directed air-guiding walls 24, 25, 26, which are preferably oriented parallel in relation to one another, on the side wall 6 in which the fan is integrated and form defined air ducts.

Further obstructions to flow are fitted in the air inlet region of this air duct on the floor, to the side of and above the power-electronics components 2, 3, 4. These flow duct modifications create the reduced flow through the central duct 11 which is most favorable in terms of flow.

Openings of different sizes ensure an approximately identical throughflow or cooling effect for the two outer power-electronics components 2, 4. Therefore, the passage of air in the central region is smaller than the passage of air in the outer edge region.

The partial air flows 27, 28, 29, illustrated in the arrow direction, in the three chambers 10, 11, 12 have different intensities.

Figure 2:
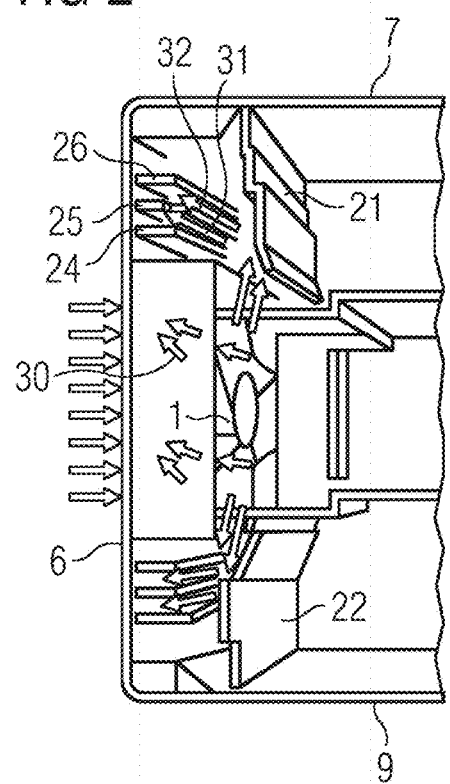
FIG. 2 shows a perspective illustration of a detail of the lower device region with a fan from FIG. 1 and defined air flow ducts.

FIG. 2 illustrates a detail of the lower device region together with a fan and defined air flow ducts. The fan is arranged in the side wall 6. Small chambers or air shafts, through which air flows from the fan, are formed through the air-guiding walls 21, 22 and the side walls 6 and, respectively, 7, 9 laterally next to the fan. The air is passed through the air-guiding walls 24, 25, 26 in defined air flow ducts 31, 32. A portion of the air which is drawn from the fan is also guided into a region 30 above the fan.

Figure 3:
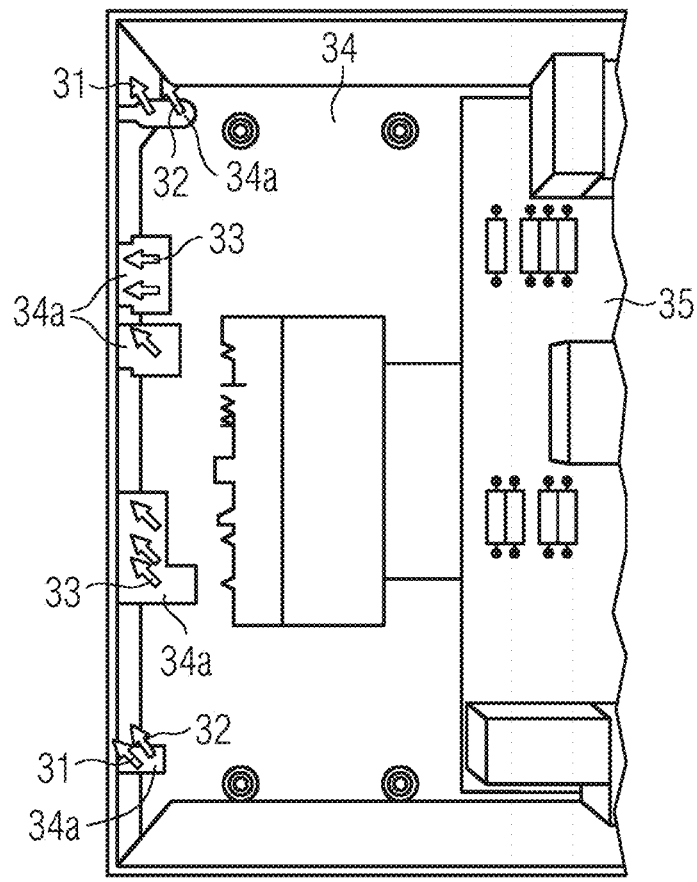
FIG. 3 shows a perspective illustration of a central housing part with defined air flow ducts which form a continuation of the air flow ducts from the lower device region.

FIG. 3 shows a central housing part with continued defined air flow ducts 31, 32 out of the lower device region and also with continued air flow ducts 33 out of the region 30 of the lower device region. The central housing part has a largely closed intermediate floor 34 with cutouts 34a, on which intermediate floor a circuit board 35, in particular an RC circuit board, is arranged.

Figure 4:
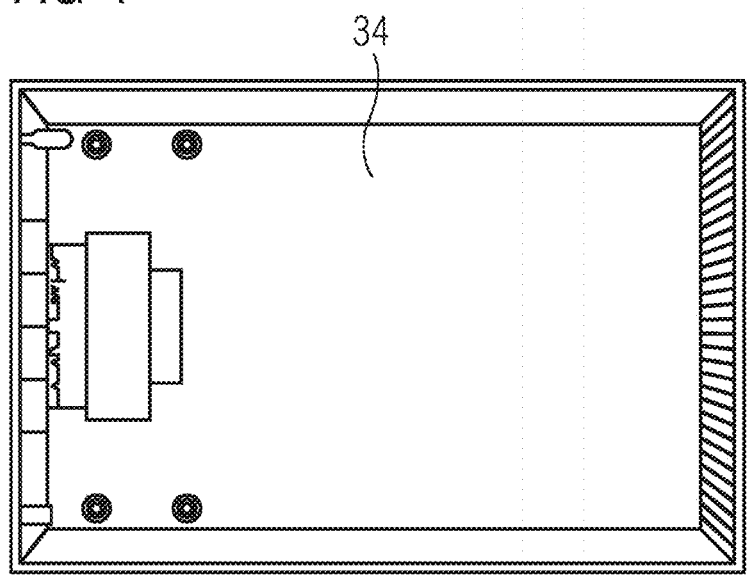
FIG. 4 shows a plan view of the illustration according to FIG. 3, without a circuit board.

FIG. 4 shows the central device region without a circuit board 35.

Figure 5:
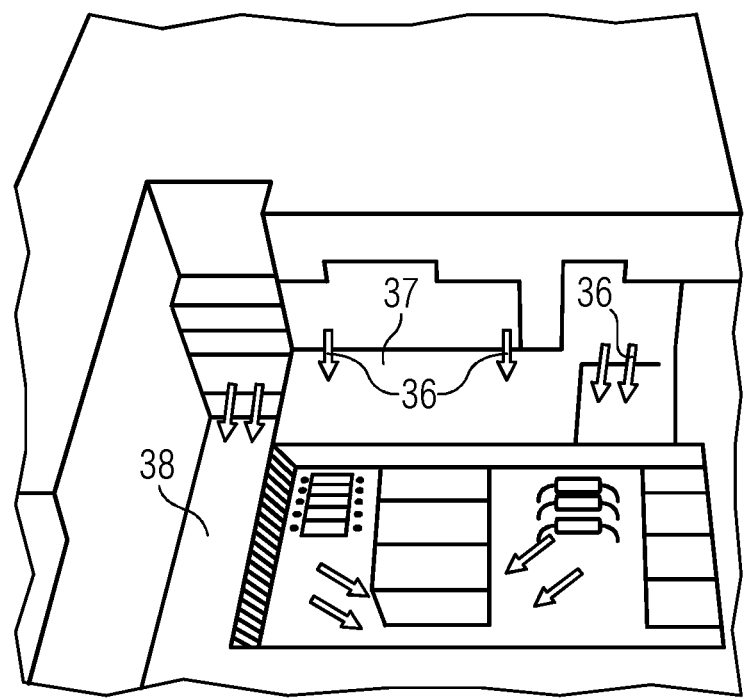
FIG. 5 shows a perspective illustration of an upper housing part with defined air flow ducts which form a continuation of the air flow ducts from the central housing part.

FIG. 5 illustrates an upper housing part with defined air flow ducts 36 which form a continuation of the air flow ducts 31, 32, 33 out of the central housing part. The upper housing part has cutouts 37, 38 in which a control section and also a communications module can be positioned.

Figure 6:
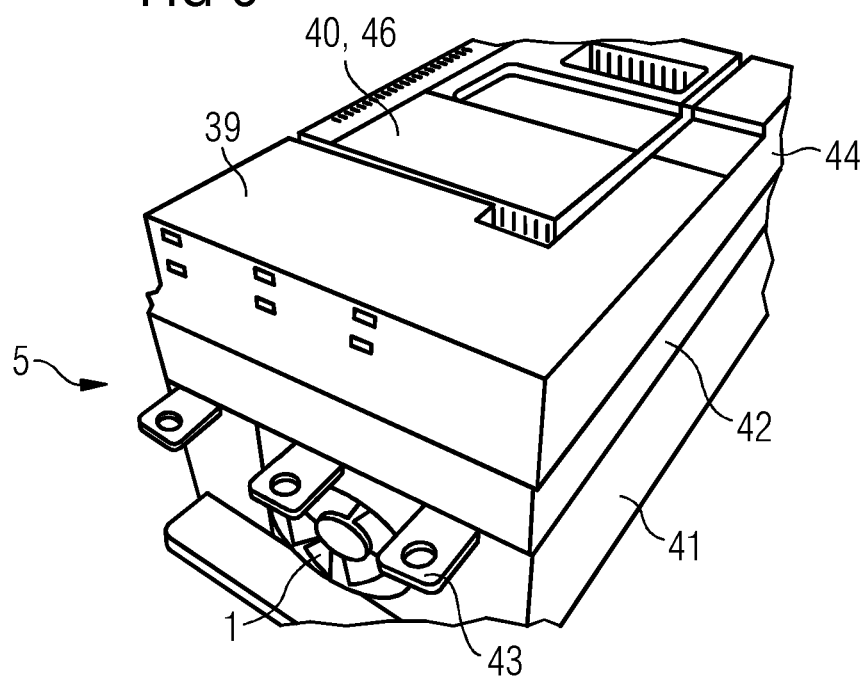
FIG. 6 shows a perspective illustration of the low-voltage switching device according to an embodiment of the invention together with the housing.

FIG. 6 shows the low-voltage switching device according to an embodiment of the invention together with the housing, wherein the fan is arranged in the side wall 6 in the lower housing region. The control section 40, having a communications module 46, is inserted into the front side 39. In addition, this illustration shows the arrangement of the three housing parts 41, 42, 44. The fan and the connections 43 are arranged in the lower housing part 41. The RC circuit board is arranged in the central housing part 42. The control section 40 is inserted in the upper housing part 44.

Figure 7:
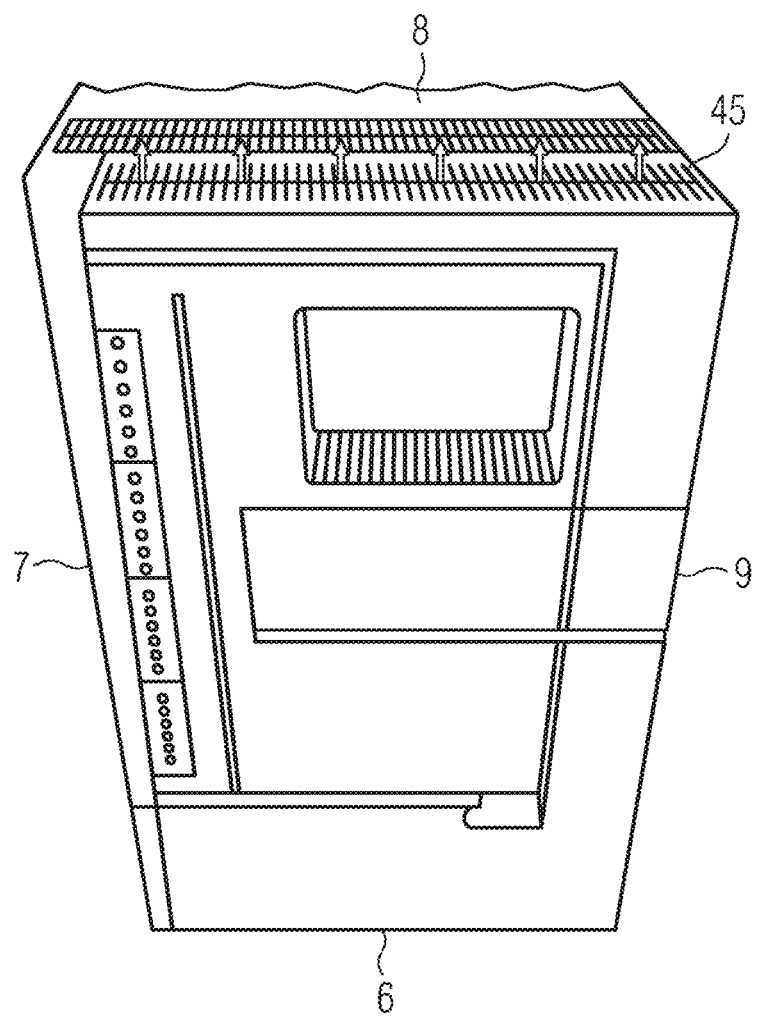
FIG. 7 shows a perspective illustration of the low-voltage switching device according to FIG. 6 with grid openings in the housing for discharging the air flows to the outside.

FIG. 7 illustrates the low-voltage switching device according to FIG. 6 together with grid openings 45 in the side wall 8 of the housing for discharging the air flows to the outside.

The low-voltage switching device according to an embodiment of the invention is distinguished in that reliable temperature regulation of the power-electronics components can be realized even with device rated currents in the range of up to 650 A.

LIST OF REFERENCE SYMBOLS

1 Cooling device(s)
2 Power-electronics component
3 Power-electronics component
4 Power-electronics component
5 Housing
6 Side wall
7 Side wall
8 Side wall
9 Side wall
10 Chamber
11 Chamber
12 Chamber
13 Partition wall
14 Partition wall
15 Side wall
16 Side wall
17 Side wall
18 Side wall
19 Air-guiding wall
20 Air-guiding wall
21 Air-guiding wall
22 Air-guiding wall
23 Constriction
24 Air-guiding wall
25 Air-guiding wall
26 Air-guiding wall
27 Partial air flow
28 Partial air flow
29 Partial air flow
30 Region
31 Air flow duct
32 Air flow duct
33 Air flow duct
34 Intermediate floor
34a Cutout
35 Circuit board
36 Air flow duct
37 Cutout
38 Cutout
39 Front side
40 Control section
41 Lower housing part
42 Central housing part
43 Connection
44 Upper housing part
45 Grid opening

The invention claimed is:
1. A low-voltage switching device with a device rated current range of up to 650 A, comprising:
a defined cooling arrangement including a structure, the structure including a lower device region and an upper device region located relatively above the lower device region, wherein power-electronics components are arranged in the lower device region; and only a single cooling device being arranged in the low-voltage switching device; and defined air flow ducts being arranged in the low-voltage switching device, included to replace a further cooling device, the air flow ducts being configured such that a main flow of ingoing cool air passes through the power-electronics components located in the lower device region, a first portion of the ingoing cool air strikes air-guiding walls and is conducted into chambers and from there is conducted upward and enters the upper device region through openings, and a second portion of the ingoing cool air strikes a further set of air-guiding walls and is conducted upward into a region above the cooling device and passes upward into the upper device region through openings, so that a secondary flow of ingoing cool air, cooling a control section located in the upper device region, is produced in the upper device region, the upper device region having a largely closed floor which serves as a separating wall between the main flow and the secondary flow of ingoing cool air.

2. The low-voltage switching device of claim 1, wherein the single cooling device is arranged in the lower device region, to guide a portion of air flow, in a form of partial air flows, to the power-electronics components arranged in the lower device region.

3. The low-voltage switching device of claim 1, wherein a portion of the air flow is guidable on air-guiding walls, protruding from opposite side walls, inward into a housing of the low-voltage switching device, forming chambers, the defined air flow ducts, to guide the air flow upward to the relatively upper device region, being arranged in the chambers.

4. The low-voltage switching of claim 1, wherein a portion of the air flow is guidable on air-guiding walls, positioned centrally in front of the cooling device in the low-voltage switching device, to guide the air flow via air ducts upward into a region, to the upper device region.

5. The low-voltage switching device of claim 3, wherein the air flows, to be guided upward into the upper device region, form the secondary flow which forms through the largely closed floor between the lower device region and the upper device region.

6. The low-voltage switching of claim 5, wherein air flows are to be guided outside of the low-voltage switching device via grid openings in the housing of the low-voltage switching device.

7. The low-voltage switching device of claim 1, wherein a communications module is arranged in a manner integrated in the control section or separately positioned in the low-voltage switching device.

8. The low-voltage switching device of claim 1, wherein the low-voltage switching device is a soft starter.

9. The low-voltage switching device of claim 2, wherein a portion of the air flow is guidable on air-guiding walls, protruding from opposite side walls, inward into a housing of the low-voltage switching device, forming chambers, the defined air flow ducts, to guide the air flow upward to the relatively upper device region, being arranged in the chambers.

10. The low-voltage switching of claim 2, wherein a portion of the air flow is guidable on air-guiding walls, positioned centrally in front of the cooling device in the low-voltage switching device, to guide the air flow via air ducts upward into a region, to the upper device region.

11. The low-voltage switching of claim 3, wherein a portion of the air flow is guidable on air-guiding walls, positioned centrally in front of the cooling device in the low-voltage switching device, to guide the air flow via air ducts upward into a region, to the upper device region.

12. The low-voltage switching device of claim 4, wherein the air flows, to be guided upward into the upper device region, form a secondary flow which forms through a largely closed intermediate floor between the lower device region and the upper device region.

13. The low-voltage switching device of claim 10, wherein the air flows, to be guided upward into the upper device region, form a secondary flow which forms through a largely closed intermediate floor between the lower device region and the upper device region.

14. The low-voltage switching device of claim 11, wherein the air flows, to be guided upward into the upper device region, form a secondary flow which forms through a largely closed intermediate floor between the lower device region and the upper device region.

15. The low-voltage switching of claim 12, wherein air flows are to be guided outside of the low-voltage switching device via grid openings in the housing of the low-voltage switching device.

16. The low-voltage switching of claim 13, wherein air flows are to be guided outside of the low-voltage switching device via grid openings in the housing of the low-voltage switching device.

17. The low-voltage switching of claim 14, wherein air flows are to be guided outside of the low-voltage switching device via grid openings in the housing of the low-voltage switching device.

18. The low-voltage switching device of claim 2, wherein a communications module is arranged in a manner integrated in a control section or separately positioned in the low-voltage switching device.

19. The low-voltage switching device of claim 2, wherein the low-voltage switching device is a soft starter.

20. The low-voltage switching device of claim 3, wherein a communications module is arranged in a manner integrated in a control section or separately positioned in the low-voltage switching device.

* * * * *